(12) United States Patent
Hung et al.

(10) Patent No.: US 7,545,178 B2
(45) Date of Patent: Jun. 9, 2009

(54) SIGNAL ENCODER AND SIGNAL DECODER

(75) Inventors: Chi-Chang Hung, Hsinchu (TW);
Yung-Sheng Wei, Hsinchu (TW);
Meng-Hsiu Wei, Hsinchu (TW)

(73) Assignee: Macroblock, Inc., Hsinchu (TW)

( * ) Notice: Subject to any disclaimer, the term of this patent is extended or adjusted under 35 U.S.C. 154(b) by 118 days.

(21) Appl. No.: 11/853,712

(22) Filed: Sep. 11, 2007

(65) Prior Publication Data

US 2008/0315920 A1 Dec. 25, 2008

(30) Foreign Application Priority Data

Jun. 22, 2007 (TW) .............................. 96122505 A

(51) Int. Cl.
*H03K 19/082* (2006.01)
(52) U.S. Cl. .............................. 326/105; 326/93; 326/26
(58) Field of Classification Search .................... 326/26, 326/27, 93–98, 105, 82–86
See application file for complete search history.

(56) References Cited

U.S. PATENT DOCUMENTS

| 3,924,186 | A  | * | 12/1975 | Gordy et al. ................. 375/281 |
| 2008/0054944 | A1 | * | 3/2008 | Kwon ........................... 326/83 |
| 2008/0112507 | A1 | * | 5/2008 | Smith et al. ................. 375/308 |

* cited by examiner

*Primary Examiner*—Don P Le
(74) *Attorney, Agent, or Firm*—Workman Nydegger

(57) ABSTRACT

A signal encoder and a signal decoder involves the signal encoder for receiving a data signal and a clock signal, including a first code output terminal and a second code output terminal. When the data signal is logic one, the signal encoder outputs a modulated signal through the first code output terminal, and outputs a fixed level signal through the second code output terminal. When the data signal is logic zero, the signal encoder outputs the fixed level signal through the first code output terminal, and outputs the modulated signal through the second code output terminal. The signal decoder converts the modulated signal and the fixed level signal output from the signal encoder into the data signal and the clock signal.

16 Claims, 15 Drawing Sheets

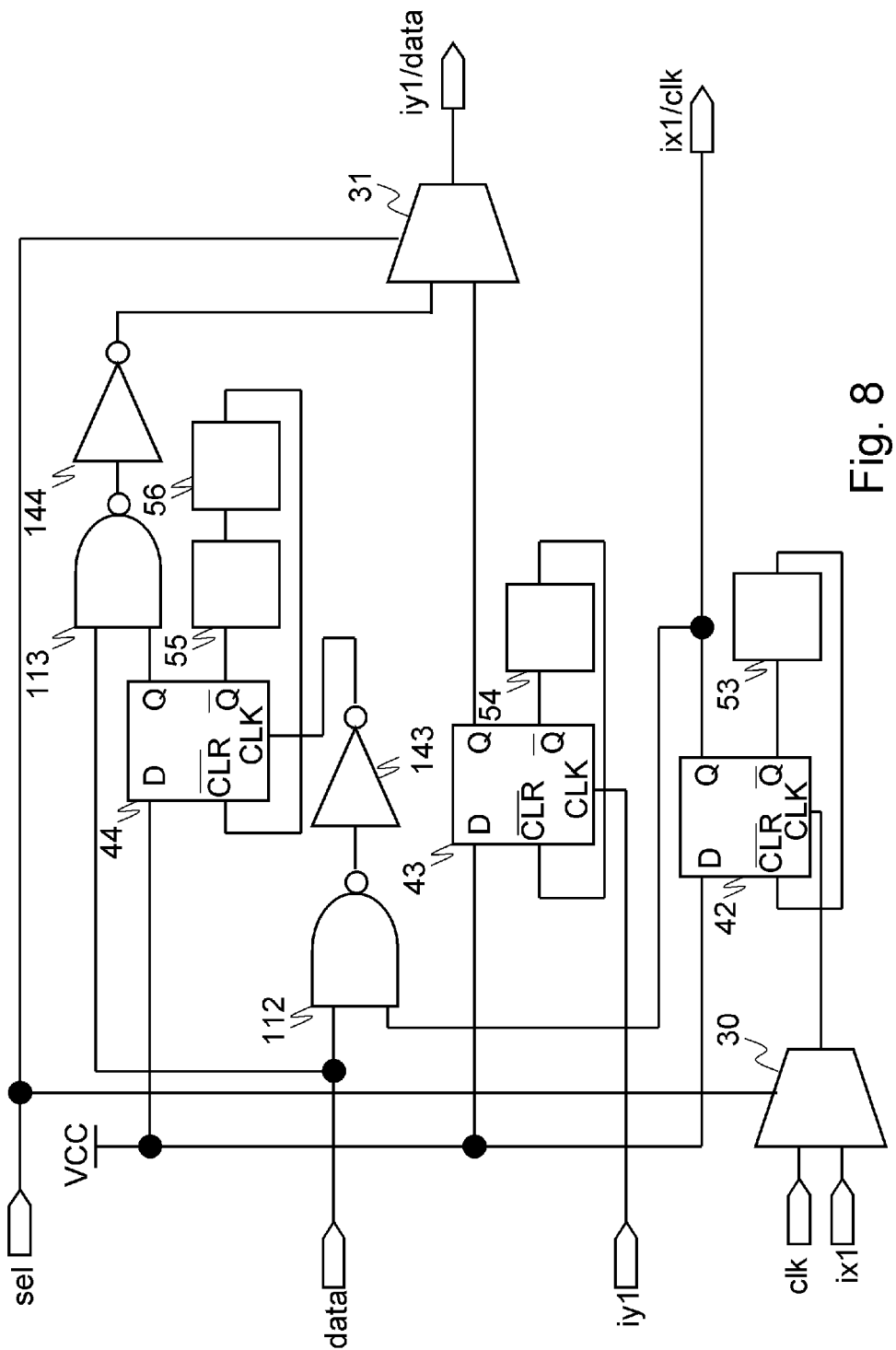

SIGNAL ENCODER AND SIGNAL DECODER

CROSS-REFERENCE TO RELATED APPLICATIONS

This non-provisional application claims priority under 35 U.S.C. § 119(a) on Patent Application No(s). 096122505 filed in Taiwan, R.O.C. on Jun. 22, 2007, the entire contents of which are hereby incorporated by reference.

BACKGROUND

1. Field of Invention

The present invention relates to a signal transmitter, and more particularly to a signal encoder and a signal decoder.

2. Related Art

With the popularity of high-speed circuits, signal characteristics of clock jitter and clock skew have drawn much attention from many engineers. As transmission rates are becoming increasingly higher, clocks are arranged more compactly, and cycles become shorter accordingly. Therefore, the clock jitter now exerts a larger influence.

A conventional digital serial transmission system adopts a data-clock transmission mode. The transmission system uses two signal lines, namely a data line for transmitting a data signal, and a clock line for transmitting a clock signal. As the data signal and the clock signal are transmitted separately, the trouble of clock recovery does not exist at the receiving terminal. Thus, a rising edge or falling edge trigger can be directly used to determine whether the data signal transmitted from the data line is logic zero or logic one. When the data signal is greater than a threshold, it is determined to be logic one. Otherwise, it is Otherwise, it is determined to be logic zero. Though this mode realizes the data transmission, with the extending of transmission distance, the above mode of data-clock transmission will be easily interfered by noise, thus making the level of the data signal entirely moving up or down, and leading to errors of data determination at the receiving terminal. For example, if the level of a signal which is logic zero originally moves up and exceeds the threshold of the above determination due to the noise interference, the receiving terminal will determine the signal is logic one, thus leading to data determination errors.

In order to solve the aforementioned problems, a differential transmission mode is adopted in some of current designs. In this mode, two output terminals (data lines) are both data signals (one is a data signal D+, and the other is a data signal D−). That is, when a data of logic one is to be transmitted, the data signal D+ has a level of logic zero, and the data signal D− is a signal with an inverted phase, and when a signal of logic zero is to be transmitted, the data signal D− is an inverted signal of logic one, and the data signal D+ has a level of logic one. When the receiving terminal receives the signals, the voltage difference obtained from the data signal D+ minus the data signal D− is used to determine logic zero or logic one. When the voltage difference is greater than 0, it is determined to be logic zero. Otherwise, it is determined to be logic one. In this manner, the above problem of noise interference can be effectively alleviated. When the transmitted signals are interfered by noise, as the two data lines are arranged in parallel, the two data lines will be interfered simultaneously, so that the levels of the data signals move up or down simultaneously. Therefore, when the receiving terminal receives the data signals, after the data signal D+ minus the data signal D−, the interference signal is subtracted, thus avoiding determination error.

Though the differential transmission mode solves the problem of noise interference, as the receiving terminal does not have clock signals corresponding to the data lines, the receiving terminal has to use the two data lines to perform clock recovery, which requires that the data output from the data output terminal is not always at the low level (logic zero) or high level (logic one) continuously. Otherwise, the clock recovery will have errors, and the data determination will have errors as well. In order to avoid errors of clock recovery, the industry has developed a data signal conversion mechanism. According to this mechanism, an original 4-bit data is transmitted in 5 bits (i.e., 4B5B), or an original 8-bit data is transmitted in 10 bits (i.e., 8B10B), such that three successive signals at the low level or high level are removed from the transmitted data signal, so as to realize correct pulse recovery. However, though this mode solves the problem of clock recovery, the original 4-bit data must be transmitted in 5 bits, and thus the transmission rate is lowered (by 1.25 times).

In addition, referring to FIG. 1, the differential transmission mode described above has another disadvantage. That is, when the data signal is transmitted on the two data lines, as described above, the problem 300 of switching noise will be generated when the data is switched (e.g., from logic one to logic zero), which will degrade the transmission quality.

Therefore, it has become a problem for researchers to provide a signal transmitter that realizes easy clock recovery and prevents the noise interference.

SUMMARY

Accordingly, the present invention is directed to providing a signal encoder and a signal decoder, which transmit signals through a specific encoding and decoding process, and recover a clock signal and a data signal in a simple manner, thereby improving the quality of signal transmission.

The signal encoder disclosed in the present invention is used for receiving the data signal and the clock signal, and outputting a differential signal corresponding to the data signal and the clock signal. The data signal is formed by a plurality of logic zeros and a plurality of logic ones. The signal encoder includes a first code output terminal and a second code output terminal. When the data signal is logic one, the signal encoder outputs a modulated signal through the first code output terminal, and outputs a fixed level signal through the second code output terminal. When the data signal is logic zero, the signal encoder outputs a fixed level signal through the first code output terminal, and outputs a modulated signal through the second code output terminal.

The signal decoder disclosed in the present invention includes a first decode output terminal and a second decode output terminal. The signal decoder receives the differential signal output from the first code output terminal and the second code output terminal of the signal encoder. When the first code output terminal is the modulated signal and the second code output terminal is the fixed level signal, the signal decoder outputs the data signal of logic one through the second decode output terminal, and outputs the clock signal through the first decode output terminal. When the first code output terminal is the fixed level signal and the second code output terminal is the modulated signal, the signal decoder outputs the data signal of logic zero through the second decode output terminal, and outputs the clock signal through the first decode output terminal.

By the use of the signal encoder and the signal decoder, the encoded clock signal and data signal are transmitted to the receiving terminal through an encoding operation process, and the clock signal and data signal are recovered at the receiving terminal through a decoding operation process. Thus, the signal transmission process has the advantage of noise-proof like the differential transmission mode, and the signal recovery process has the advantage of easy recovery like the data-clock transmission mode, thereby improving the quality of signal transmission.

As for features and examples of the present invention, preferred embodiments will be illustrated below in detail with reference to the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein:

FIG. 8 is a schematic circuit diagram of the signal selector of the present invention.

DETAILED DESCRIPTION

Figure 1:
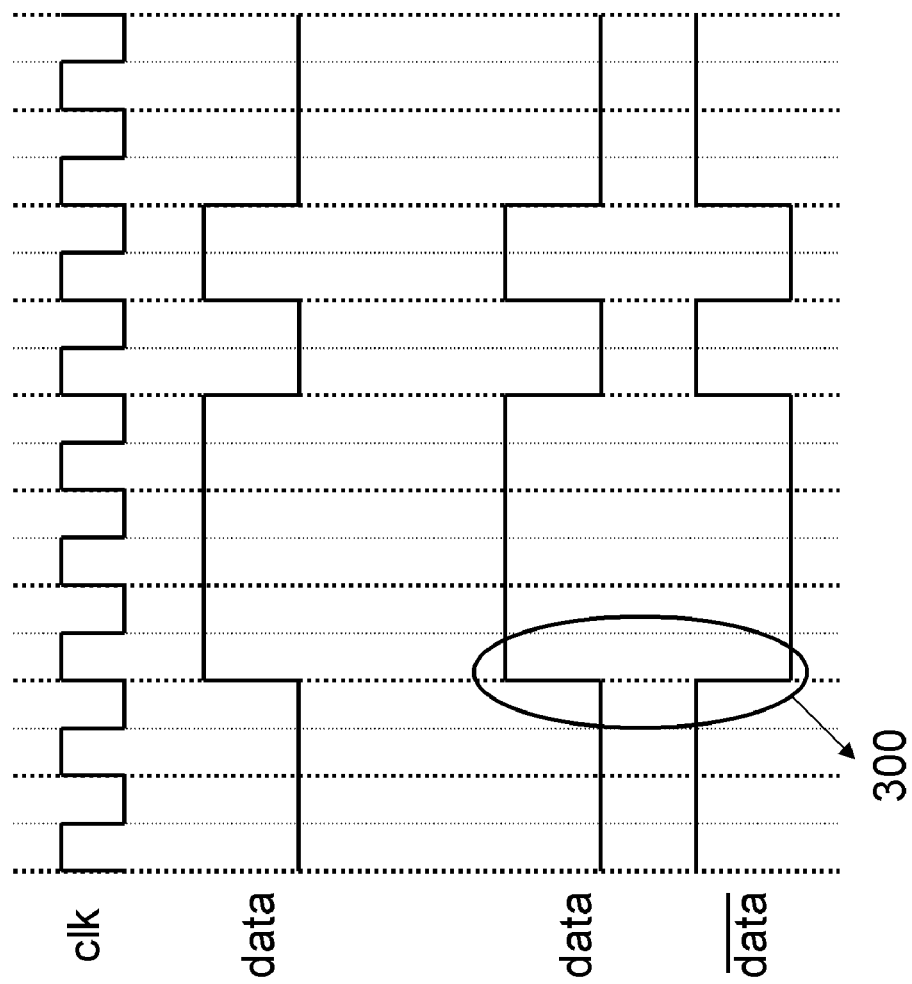
FIG. 1 is a schematic view of the comparison of signal waveforms of the prior art.
Figure 2:
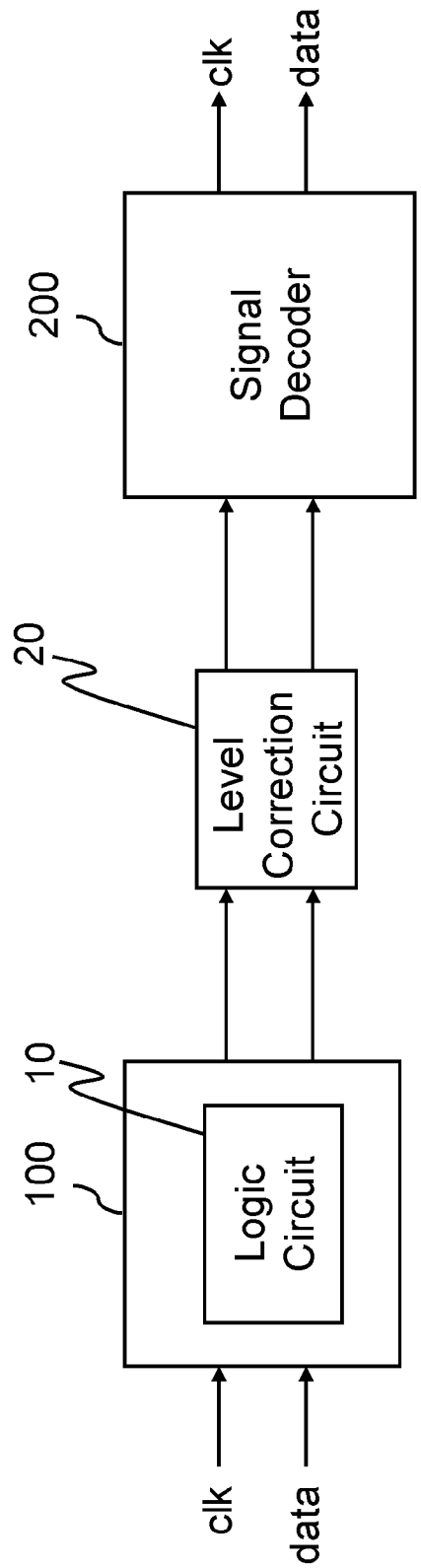
FIG. 2 is a systematic block diagram of an embodiment of the present invention.

FIG. 2 is a systematic block diagram of an embodiment of the present invention. As shown in FIG. 2, a signal transmitter of the present invention includes a signal encoder 100 and a signal decoder 200.

The signal encoder 100 receives a data signal and a clock signal, and outputs differential signals (referred to as a first differential signal and a second differential signal hereinafter for the convenience of illustration) corresponding to the data signal and the clock signal. The data signal and the clock signal are digital signals. The data signal is composed of a plurality of level signals of logic zero (e.g., 0 volt) and a plurality of level signals of logic one (e.g., 3.3 volt). The signal encoder 100 includes a first code output terminal and a second code output terminal. When the data signal is logic one, the signal encoder 100 outputs a modulated signal through the first code output terminal, and outputs a fixed level signal through the second code output terminal (e.g., a level signal of logic zero or a level signal of logic one). When the data signal is logic zero, the signal encoder 100 outputs a fixed level signal through the first code output terminal, and outputs a modulated signal through the second code output terminal.

A logic circuit 10 is disposed in the signal encoder 100 for receiving the data signal and the clock signal. When the data signal is logic one, the logic circuit 10 outputs the modulated signal through the first code output terminal of the signal encoder 100, and outputs the fixed level signal through the second code output terminal of the signal encoder 100. When the data signal is logic zero, the logic circuit 10 outputs the fixed level signal through the first code output terminal, and outputs the modulated signal through the second code output terminal. The modulated signal is formed by a plurality of low-level signals and a plurality of high-level signals. The pulse width of the modulated signal can be equal to the pulse width of a half cycle of the clock signal, or can be adjusted to a fixed value according to practical requirements. Preferably, the pulse width is set to be equal to the pulse width of half cycle of the clock signal. Thus, the receiving terminal directly integrates the first differential signal ix and the second differential signal iy to form the clock signal.

The signal decoder 200 provides a receiving terminal for reading the clock signal and the data signal. The signal decoder 200 includes a first decode output terminal and a second decode output terminal. The signal decoder 200 receives the first differential signal ix and the second differential signal iy output from the first code output terminal and the second code output terminal of the signal encoder, and performs a logic operation on the first differential signal ix and the second differential signal iy. According to the result of the logic operation, when the first code output terminal is the modulated signal and the second code output terminal is the fixed level signal, the signal decoder 200 outputs the data signal of logic one through the second decode output terminal, and outputs the clock signal through the first decode output terminal. When the first code output terminal is the fixed level signal and the second code output terminal is the modulated signal, the signal decoder 200 outputs the data signal of logic zero through the second decode output terminal, and outputs the clock signal through the first decode output terminal.

A level correction circuit 20 is disposed between the signal encoder 100 and the signal decoder 200, and is used to receive the first differential signal ix and the second differential signal iy output from the signal encoder 100, and correct the levels of the first differential signal ix and the second differential signal iy to be within a predetermined range, such that levels of the first differential signal ix and the second differential signal iy are in conformity with the level of the receiving terminal, and then transmitted to the signal decoder 200. In addition, the level correction circuit 20 can be disposed in the signal encoder 100 or in the signal decoder 200.

Figure 3A:
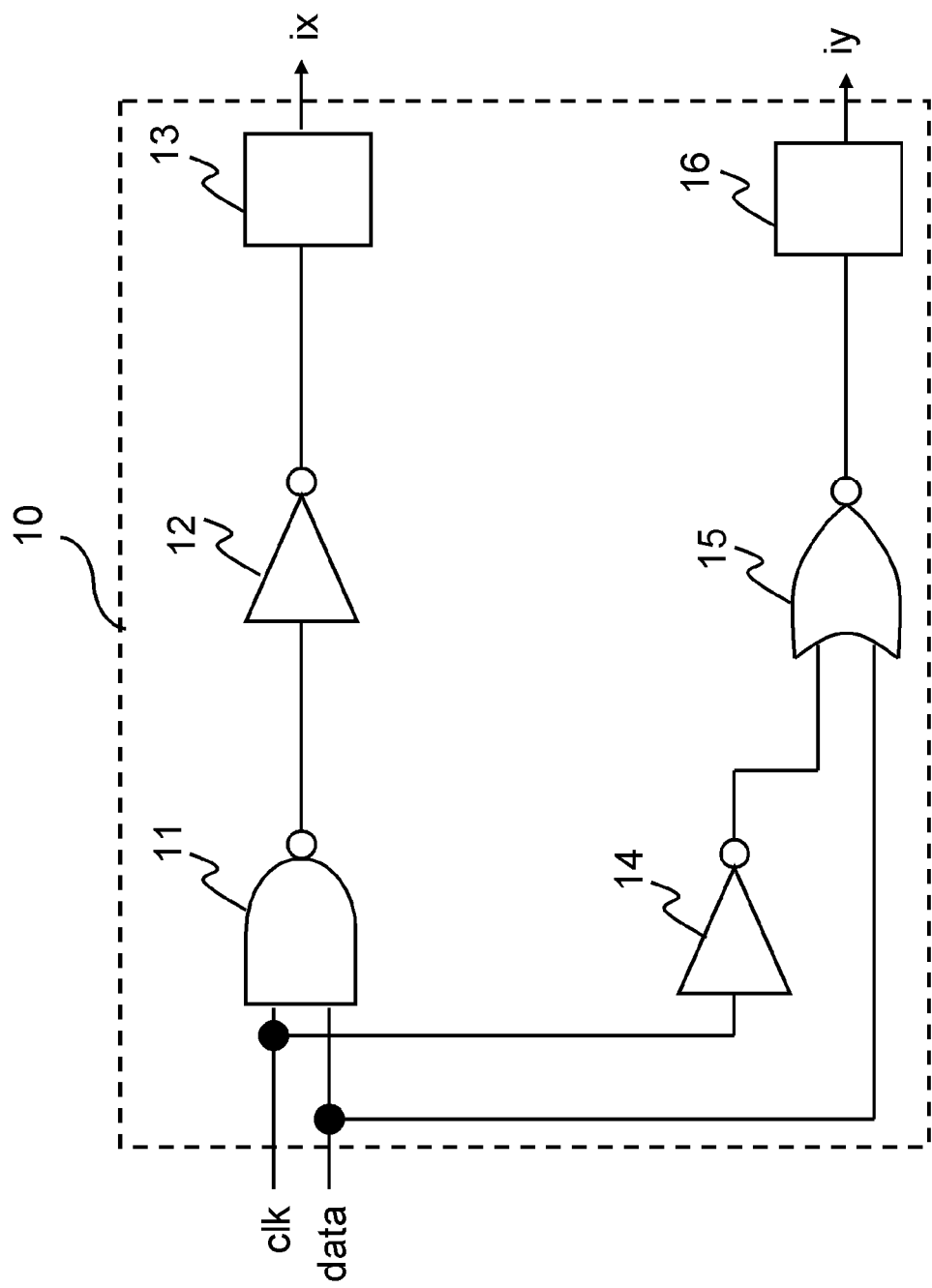
FIG. 3A is a schematic circuit diagram of a signal encoder according to the first embodiment of the present invention.

FIG. 3A is a schematic circuit diagram of a signal encoder according to the first embodiment of the present invention. As shown in FIG. 3A, the signal encoder according to the first embodiment of the present invention includes a first NAND gate 11, a first inverter 12, a first one-shot trigger 13, a second inverter 14, a first NOR gate 15, and a second one-shot trigger 16.

The first NAND gate 11 has two input terminals and one output terminal. A first input terminal of the first NAND gate 11 receives the data signal, and a second input terminal of the first NAND gate 11 receives the clock signal. After the first NAND gate 11 performs an NAND operation on the data signal and the clock signal, a first signal is output from the output terminal of the first NAND gate 11. The rules of the NAND operation are described as follows. When the signal received by the first input terminal or the second input terminal of the first NAND gate 11 is in a low-level state, the first signal output from the output terminal of the NAND gate 11 is in a high-level state. When the signals received by the first input terminal and the second input terminal of the first NAND gate 11 are in the high-level state at the same time, the first signal output from the output terminal of the first NAND gate 11 is in the low-level state.

The first inverter 12 is electrically connected with the output terminal of the first NAND gate 11, and has one input terminal and one output terminal, and is used to receive the first signal output from the first NAND gate 11, perform an inverting logic operation on the first signal, and output the inverted first signal through the output terminal of the first inverter 12. The rules of the inverting logic operation are described as follows. When the first signal received by the input terminal of the first inverter 12 is in the low-level state, the first signal output from the output terminal of the first inverter 12 is in the high-level state. When the first signal received by the input terminal of the first inverter 12 is in the high-level state, the first signal output from the output terminal of the first inverter 12 is in the low-level state.

The first one-shot trigger 13 is electrically connected with the first inverter 12, and has one input terminal and one output terminal, and is used to receive the first signal output from the first inverter 12, and output the first signal with different pulse widths through the pulse trigger of the first signal. For example, the pulse width output from the first one-shot trigger 13 is set to be greater than the pulse width output by the first inverter 12 or equal to the pulse width of the half cycle of the clock signal. The first one-shot trigger 13 is a positive-edge-triggered one-shot trigger, and can also be a negative-edge-triggered one-shot trigger.

The second inverter 14 has one input terminal and one output terminal, and is used to receive the clock signal, perform an inverting logic operation on the clock signal, and then output the inverted clock signal through the output terminal of the second inverter 14. The rules of the inverting logic operation are described as follows. When the clock signal received by the input terminal of the second inverter 14 is in the low-level state, the clock signal output from the output terminal of the second inverter 14 is in the high-level state. When the clock signal received by the input terminal of the second inverter 14 is in the high-level state, the clock signal output from the output terminal of the second inverter 14 is in the low-level state.

The first NOR gate 15 is electrically connected with the output terminal of the second inverter 14, and has two input terminals and one output terminal. A first input terminal of the first NOR gate 15 receives the inverted clock signal output from the second inverter 14, and a second input terminal of the first NOR gate 15 receives the data signal. The first NOR gate 15 performs an NOR operation on the data signal and the inverted clock signal, and outputs a second signal through the output terminal of the first NOR gate 15. The rules of the NOR operation are described as follows. When the signal received by the first input terminal or the second input terminal of the first NOR gate 15 is in the high-level state, the second signal output from the output terminal of the first NOR gate 15 is in the low-level state. When the signals received by the first input terminal and the second input terminal of the first NOR gate 15 are in the low-level state at the same time, the second signal output from the output terminal of the first NOR gate 15 is in the high-level state.

The second one-shot trigger 16 is electrically connected with the output terminal of the first NOR gate 15, and has an input terminal and an output terminal, and is used to receive the second signal output from the first NOR gate 15, and output the second signal of a different pulse width through the pulse trigger of the second signal. For example, the pulse width output by the second one-shot trigger 16 is greater than the pulse width output from the first NOR gate 15. Here, the second one-shot trigger 16 is a positive-edge-triggered one-shot trigger.

Then, the operating principles of the circuit are illustrated as follows.

Figure 6A:
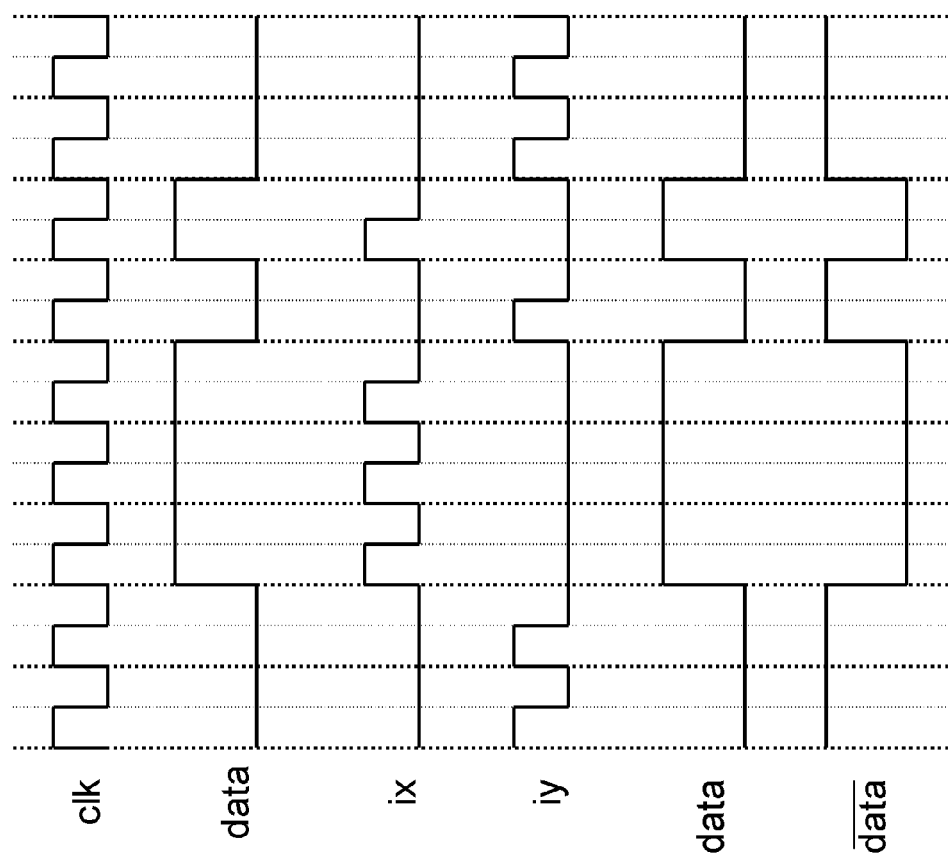
FIG. 6A is a schematic view of the comparison between the signal waveforms of the present invention and the prior art.

When the data signal is logic one, the first NAND gate 11 performs the NAND logic operation on the clock signal and the data signal and then outputs the first signal. The first inverter 12 performs the inverting logic operation on the first signal and then outputs the inverted first signal. Then, the first one-shot trigger 13 sets the output pulse width of the inverted first signal and outputs the modulated signal, i.e., the first differential signal ix (as shown in FIG. 6A).

When the data signal is logic one, the second inverter 14 performs the inverting logic operation on the clock signal and outputs the inverted clock signal. Then, the first NOR gate 15 performs the NOR logic operation on the inverted clock signal and the data signal and outputs the second signal. The second one-shot trigger 16 sets the output pulse width of the second signal, and outputs the fixed level signal, i.e., the second differential signal iy (as shown in FIG. 6A).

When the data signal is logic zero, the first NAND gate 11 performs the NAND logic operation on the clock signal and the data signal and outputs the first signal. The first inverter 12 performs the inverting logic operation on the first signal and outputs the inverted first signal. Then, the first one-shot trigger 13 sets the output pulse width of the inverted first signal and outputs the fixed level signal, i.e., the first differential signal ix (as shown in FIG. 6A).

When the data signal is logic zero, the second inverter 14 performs the inverting logic operation on the clock signal and outputs the inverted clock signal. Then, the first NOR gate 15 performs the NOR logic operation on the inverted clock signal and the data signal and outputs the second signal. The second one-shot trigger 16 sets the output pulse width of the second signal and outputs the modulated signal, i.e., the second differential signal iy (as shown in FIG. 6A).

Figure 3B:
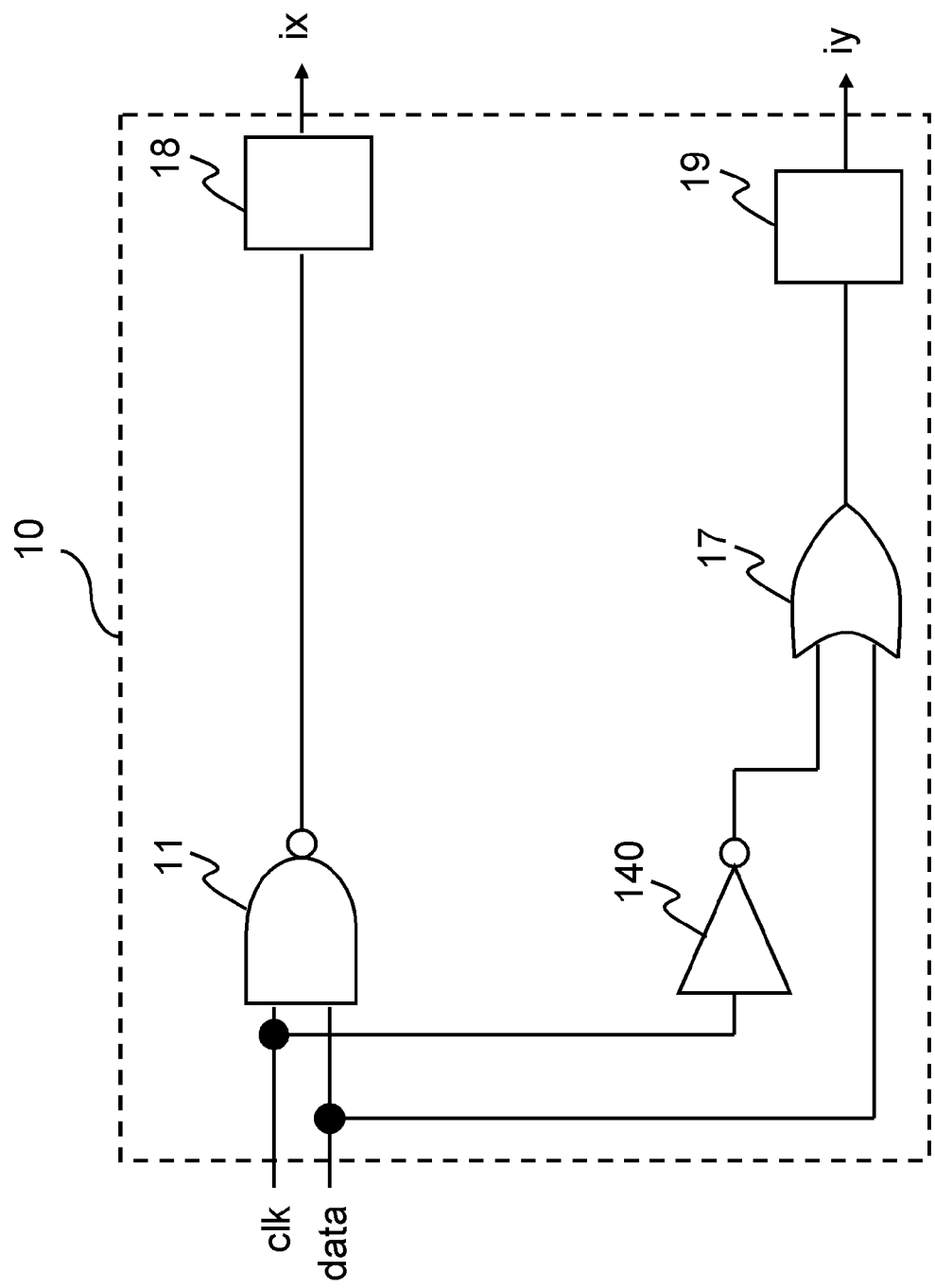
FIG. 3B is a schematic circuit diagram of a signal encoder according to the second embodiment of the present invention.

FIG. 3B is a schematic circuit diagram of a signal encoder according to the second embodiment of the present invention. As shown in FIG. 3B, the signal encoder according to the second embodiment of the present invention includes a first NAND gate 11, a first one-shot trigger 18, a second inverter 14, an OR gate 17, and a second one-shot trigger 19.

The first NAND gate 11 has two input terminals and one output terminal. A first input terminal of the first NAND gate 11 receives the data signal, and a second input terminal of the first NAND gate 11 receives the clock signal. The first NAND gate 11 performs an NAND operation on the data signal and the clock signal, and outputs the first signal through the output terminal of the first NAND gate 11. The rules of the NAND operation are described as follows. When the signal received by the first input terminal or the second input terminal of the first NAND gate 11 is in the low-level state, the first signal output from the output terminal of the first NAND gate 11 is in the high-level state. When the signals received by the first input terminal and the second input terminal of the first NAND gate 11 are in the high-level state at the same time, the first signal output from the output terminal of the first NAND gate 11 is in the low-level state.

The first one-shot trigger 18 is electrically connected with the output terminal of the first NAND gate 11, and has an input terminal and an output terminal, and is used to receive the first signal output from the first NAND gate 11, and output the first signal of a different pulse width through the pulse trigger of the first signal. For example, the output pulse width of the first one-shot trigger 18 is greater than the output pulse width of the first NAND gate 11. Here, the first one-shot trigger 18 is a negative-edge-triggered one-shot trigger.

The inverter 140 has one input terminal and one output terminal, and is used to receive the clock signal, and perform an inverting operation on the clock signal, and then output the inverted clock signal through the output terminal of the inverter 140. The rules of the inverting operation are described as follows. When the clock signal received by the input terminal of the inverter 140 is in the low-level state, the clock signal output from the output terminal of the inverter 140 is in the high-level state. When the clock signal received by the input terminal of the inverter 140 is in the high-level state, the clock signal output from the output terminal of the inverter 140 is in the low-level state.

The OR gate 17 is electrically connected with the output terminal of the inverter 140, and has two input terminals and one output terminal. A first input terminal of the OR gate 17 receives the inverted clock signal output by the inverter 140, and a second input terminal of the OR gate 17 receives the data signal. The OR gate 17 performs an OR operation on the data signal and the inverted clock signal and outputs the second signal through the output terminal of the OR gate 17. The rules of the OR operation are described as follows. When the signal received by the first input terminal or the second input terminal of the OR gate 17 is in the high-level state, the second signal output from the output terminal of the OR gate 17 is in the high-level state. When the signals received by the first input terminal and the second input terminal of the OR gate 17 are in the low-level state at the same time, the second signal output from the output terminal of the OR gate 17 is in the low-level state.

The second one-shot trigger 19 is electrically connected with the output terminal of the OR gate 17, and has one input terminal and one output terminal, and is used to receive the second signal output from the OR gate 17, and output the second signal of a different pulse width through the pulse trigger of the second signal. For example, the pulse width output by the second one-shot trigger 19 is greater than the output pulse width of the OR gate 17. Here, the second one-shot trigger 19 is a negative-edge-triggered one-shot trigger.

Then, the operating principles of the circuit are illustrated as follows.

When the data signal is logic one, the first NAND gate 11 performs the NAND logic operation on the clock signal and the data signal and outputs the first signal. Then, the first one-shot trigger 18 sets the output pulse width of the first signal and outputs the modulated signal, i.e., the first differential signal ix.

When the data signal is logic one, the inverter 140 performs the inverting logic operation on the clock signal, and outputs the inverted clock signal. Then, the OR gate 17 performs the OR logic operation on the inverted clock signal and the data signal, and outputs the second signal. The second one-shot trigger 19 sets the output pulse width of the second signal and outputs the fixed level signal, i.e., the second differential signal iy.

When the data signal is logic zero, the first NAND gate 11 performs the NAND logic operation on the clock signal and the data signal, and outputs the first signal. Then, the first one-shot trigger 18 sets the output pulse width of the first signal, and outputs the fixed level signal, i.e., the first differential signal ix.

When the data signal is logic zero, the inverter 140 performs the inverting logic operation on the clock signal, and outputs the inverted clock signal. Then, the OR gate 17 performs the OR logic operation on the inverted clock signal and the data signal, and outputs the second signal. The second one-shot trigger 19 sets the output pulse width of the second signal, and outputs the modulated signal, i.e., the second differential signal iy.

Figure 4:
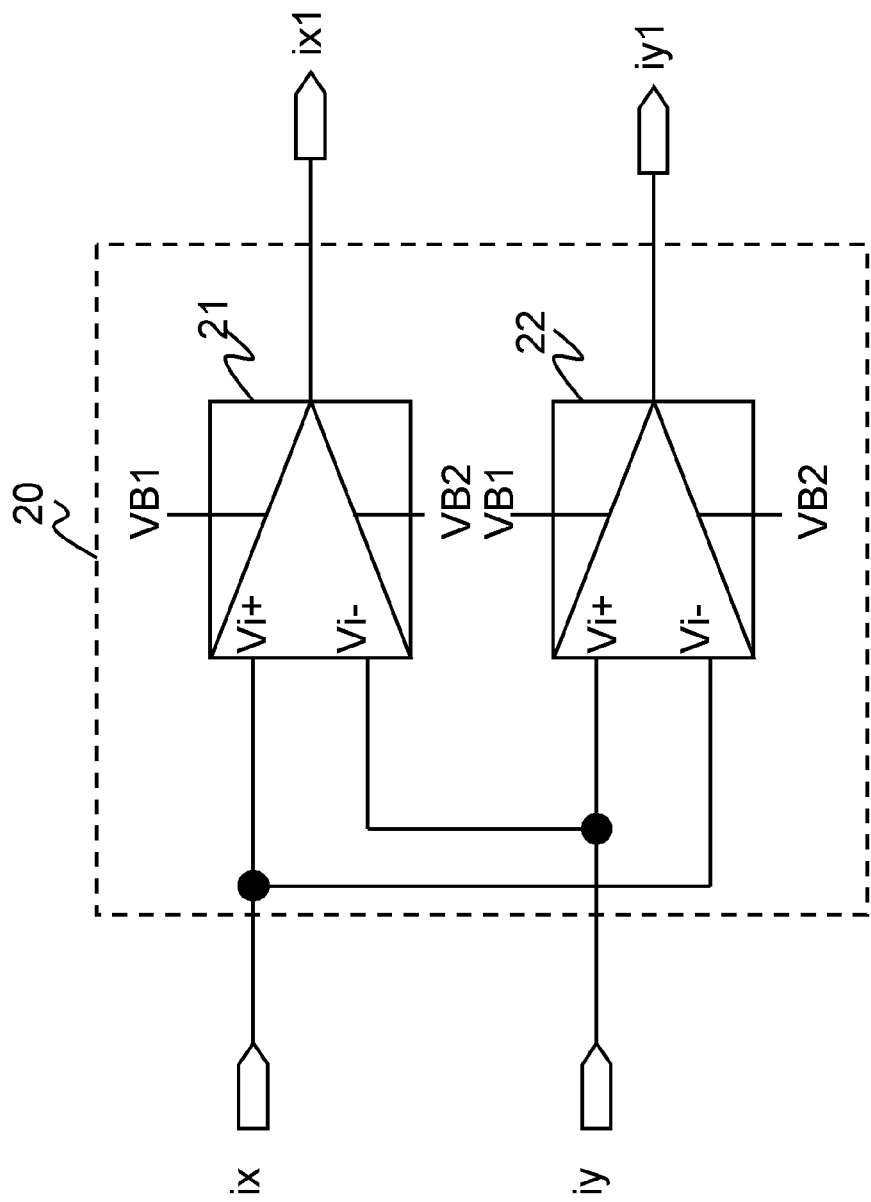
FIG. 4 is a schematic view of a level correction circuit of the present invention.

FIG. 4 is a schematic view of a level correction circuit of the present invention. As shown in FIG. 4, the level correction circuit of the present invention includes a first comparator 21 and a second comparator 22.

The first comparator 21 has two input terminals and one output terminal. A first input terminal (i.e., the non-inverting input terminal Vi+) of the first comparator 21 receives the first differential signal ix output from the first code output terminal of the signal encoder 100, and a second input terminal (i.e., the inverting input terminal Vi−) of the first comparator 21 receives the second differential signal iy output from the second code output terminal of the signal encoder 100. The first comparator 21 performs a comparison operation on the first differential signal ix and the second differential signal iy, so as to output a third differential signal ix1 of an accurate level. Thus, the problem of signal attenuation of the first differential signal ix during transmission can be solved. The first comparator 21 raises the level of the inverting input terminal Vi− to be greater than 0 but smaller than a voltage source VCC (e.g., to ½VCC), so as to solve the problem occurs when the input signals of the two input terminals of the first comparator 21 are both logic zero.

The second comparator 22 has two input terminals and one output terminal. A first input terminal (i.e., the non-inverting input terminal Vi+) of the second comparator 22 receives the second differential signal iy output from the second output terminal (i.e., the inverting input terminal Vi−) of the signal encoder 100, a second input terminal of the second comparator 22 receives the first differential signal ix output from the first code output terminal of the signal encoder 100. The second comparator 22 performs the comparison operation on the first differential signal ix and the second differential signal iy, so as to output a fourth differential signal iy1 of an accurate level. Thus, the problem of signal attenuation of the second differential signal iy during transmission can be solved. The second comparator 22 raises the level of the inverting input terminal Vi− to be greater than 0 but smaller than the voltage source VCC (e.g., to ½VCC), so as to solve the problem occurs when the input signals of the two input terminals of the second comparator 22 are both logic zero.

Figure 5A:
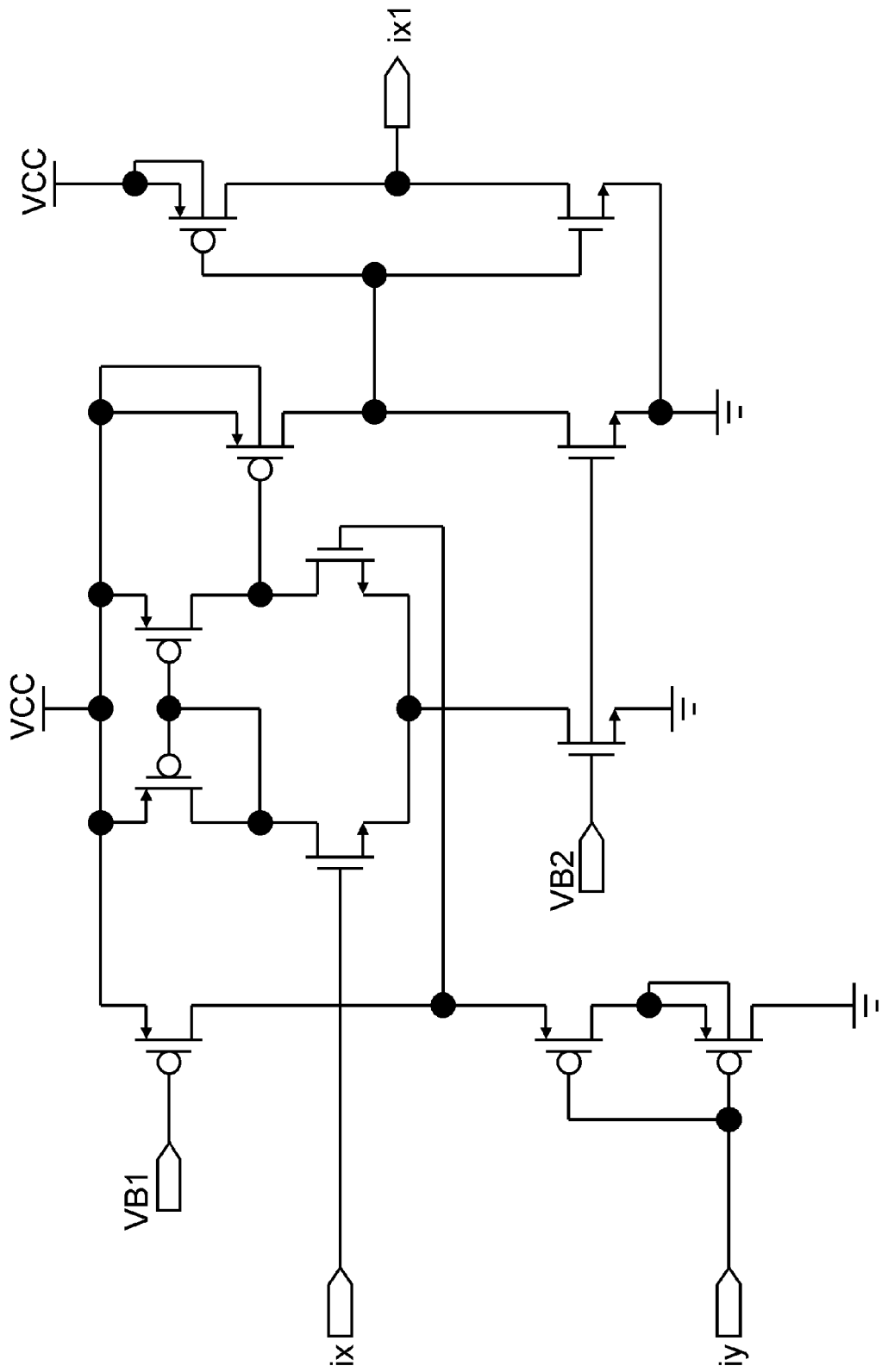
FIG. 5A is a schematic circuit diagram of the first comparator of the present invention.

FIG. 5A is a schematic circuit diagram of the first comparator of the present invention. The first comparator of the present invention as shown in FIG. 5A includes a plurality of transistor switches. After the first differential signal ix and the second differential signal iy are input into the transistor switches, the transistor switches are controlled to be on or off according to the levels of the first differential signal ix and the second differential signal iy, so as to output the third differential signal ix1 of an accurate level. In addition, the circuit of the second comparator of the present invention is the same as that of the first comparator, and the difference is described as follows. The first input terminal (i.e., the non-inverting input terminal Vi+) of the first comparator 21 receives the first differential signal ix output from the first code output terminal of the signal encoder 100 (as shown in FIG. 6A), while the first input terminal (i.e., the non-inverting input terminal Vi+) of the second comparator 22 receives the second differential signal iy output from the second output terminal (i.e., the inverting input terminal Vi−) of the signal encoder 100 (as shown in FIG. 6A). Other operating principles of the circuits are the same, and will not be described herein again.

Figure 5B:
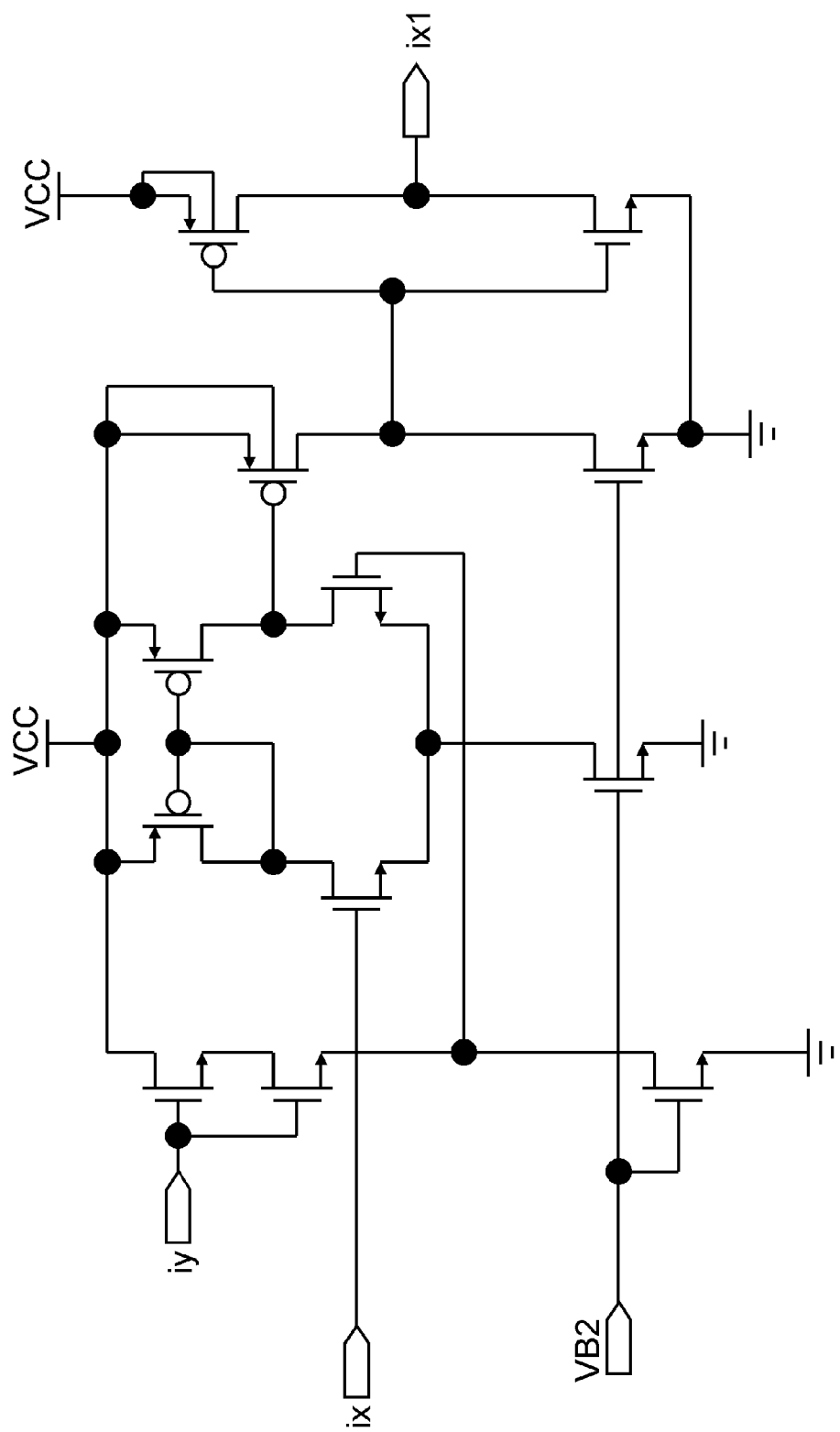
FIG. 5B is another schematic circuit diagram of the first comparator of the present invention.

FIG. 5B is another schematic circuit diagram of the first comparator of the present invention. The first comparator of the present invention as shown in FIG. 5B includes a plurality of transistor switches. The first differential signal ix (as shown in FIG. 6D) and the second differential signal (as shown in FIG. 6D) received in FIG. 5B are in opposite phases. Other operating principles of the circuit are the same as those of FIG. 5A, and will not be described herein again.

FIG. 6A is a schematic view of the comparison between the signal waveforms of the present invention and the prior art. As shown in FIG. 6A, according to the prior art, the data signal data and the inverted data signal $\overline{data}$ have the problem of switching noise during transmission, which degrades the transmission quality. However, after the signal encoder 100 of the present invention receives the clock signal and the data signal, the data signal and the clock signal are encoded into the first differential signal ix and the second differential signal iy according to certain encoding rules. At the receiving terminal, the first differential signal ix plus the second differential signal iy can recover the clock signal, and the first differential signal ix minus the second differential signal iy can recover the data signal, according to certain decoding rules. The pulse width of the first differential signal ix and the pulse width of the second differential signal are equal to a half cycle of the clock signal clk. Thus, the present invention converts the data signal and the clock signal into the modulated signal and the fixed level signal, respectively. As the modulated signal and the fixed level signal do not have a switching relationship of opposite phases, the problem of switching noise will not occur. Therefore, the present invention has better transmission quality as compared with the conventional differential transmission mode.

Figure 6B:
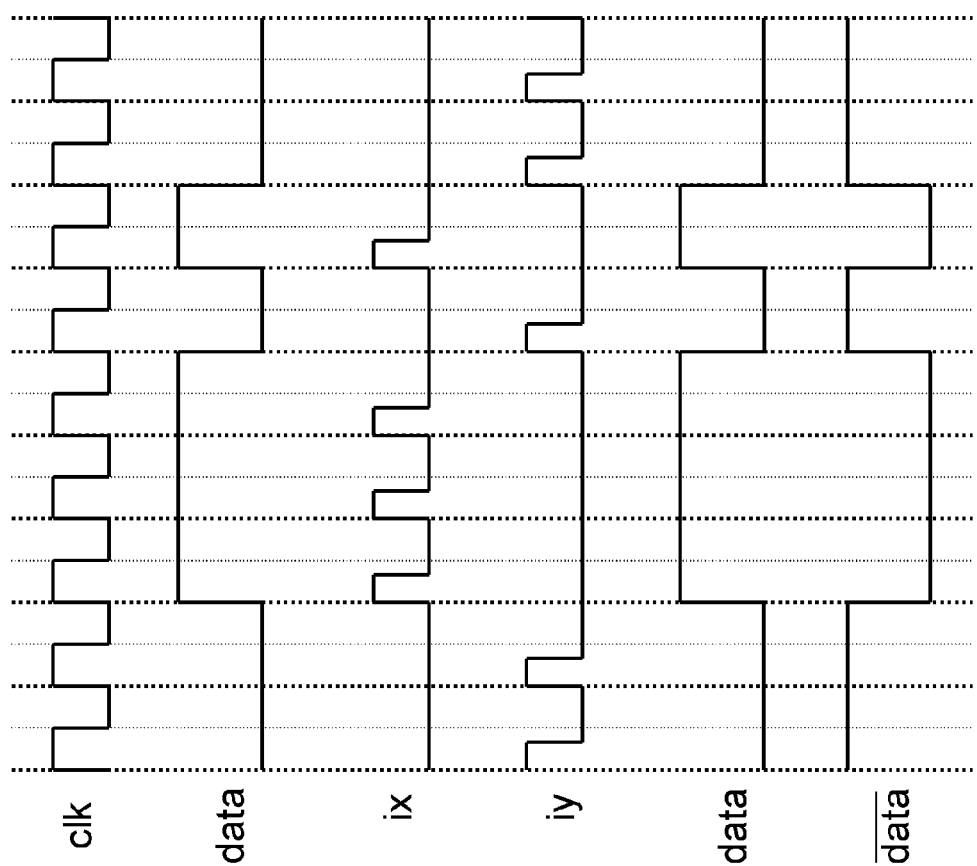
FIG. 6B is another schematic view of the comparison between the signal waveforms of the present invention and the prior art.

FIG. 6B is another schematic view of the comparison between the signal waveforms of the present invention and the prior art. The difference between FIGS. 6B and 6A is described as follows. The pulse width of the first differential signal ix of FIG. 6B is smaller than the pulse width of the first differential signal ix of FIG. 6A. In other words, the pulse width of the first differential signal ix of FIG. 6B is smaller than a half cycle of the clock. The pulse width of the second differential signal iy of FIG. 6B is smaller than the pulse width of second differential signal iy of FIG. 6A. In other words, the pulse width of the second differential signal iy is smaller than a half cycle of the clock signal clk. The pulse widths can be adjusted through the one-shot trigger.

Figure 6C:
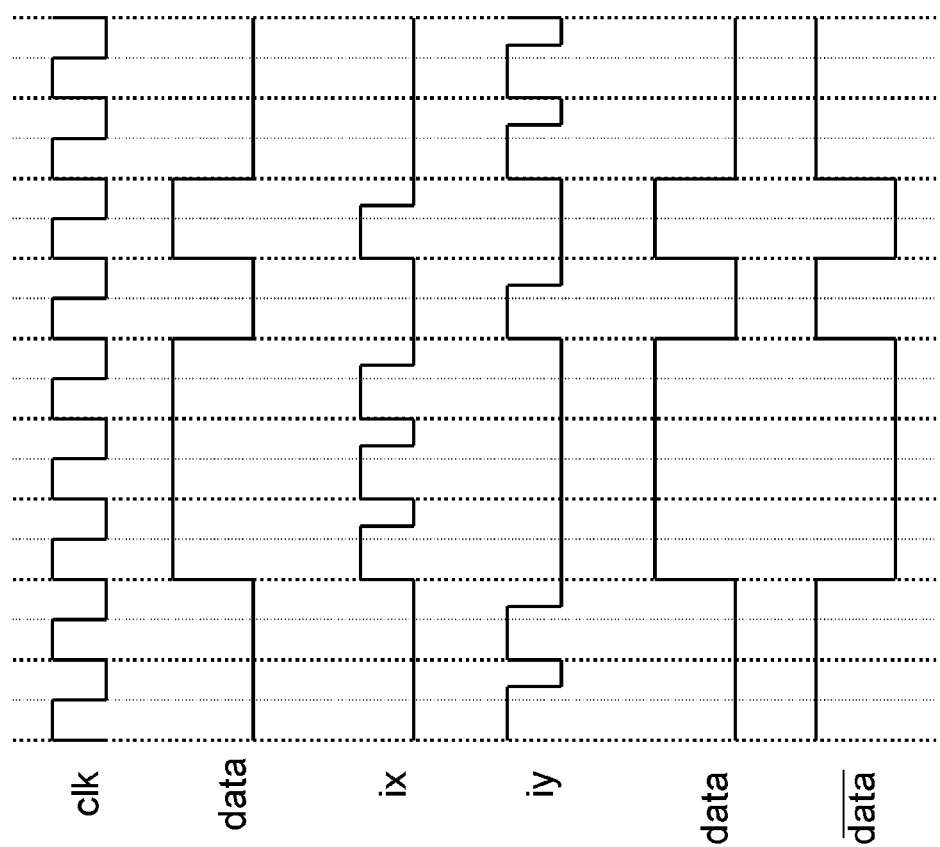
FIG. 6C is another schematic view of the comparison between the signal waveforms of the present invention and the prior art.
Figure 6D:
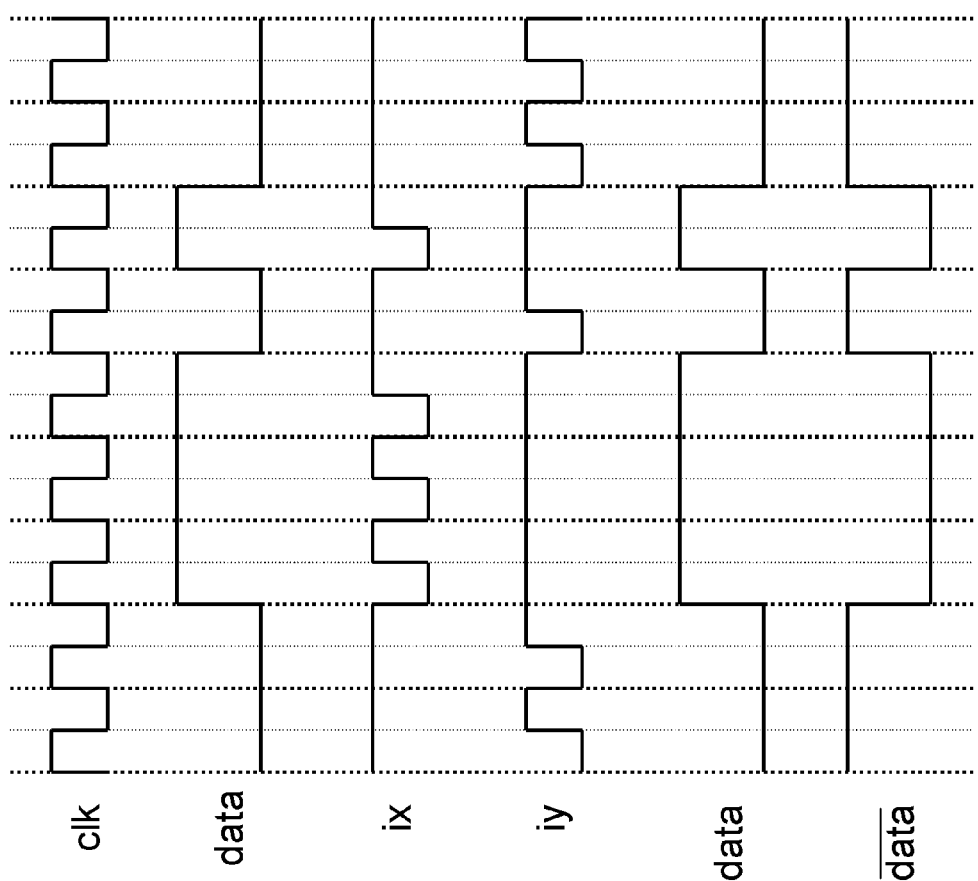
FIG. 6D is another schematic view of the comparison between the signal waveforms of the present invention and the prior art.

FIG. 6C is another schematic view of the comparison between the signal waveforms of the present invention and the prior art. The difference between FIGS. 6C and 6A is described as follows. The pulse width of the first differential signal ix of FIG. 6C is greater than the pulse width of the first differential signal ix of FIG. 6A. In other words, the pulse width of the first differential signal ix of FIG. 6C is greater than a half cycle of the clock signal clk. The pulse width of the second differential signal iy of FIG. 6C is greater than the pulse width of the second differential signal iy of FIG. 6A. In other words, the pulse width of the second differential signal iy of FIG. 6C is greater than a half cycle of the clock signal clk. The pulse widths can be adjusted through the one-shot trigger.

Figure 7A:
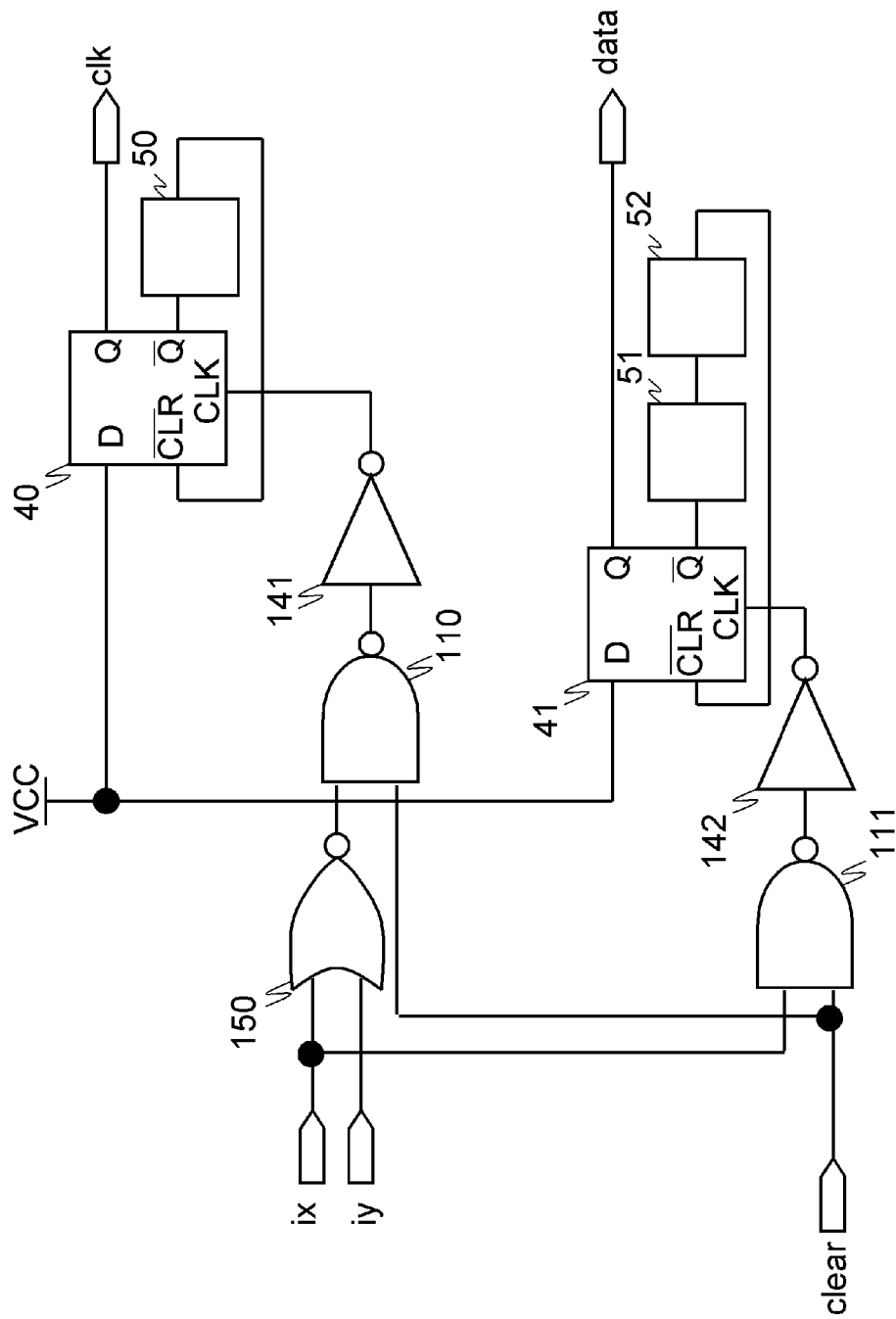
FIG. 7A is a schematic circuit diagram of the signal selector of the present invention.

FIG. 7A is a schematic circuit diagram of the signal decoder of the present invention. As shown in FIG. 7A, the signal decoder of the present invention includes a first flip-flop 40, a second flip-flop 41, a first delayer 50, a second delayer 51, a third delayer 52, a second NAND gate 110, a third NAND gate 111, a third inverter 141, a fourth inverter 142, and a second NOR gate 150. The first flip-flop 40 and the first delayer 50 form constitute a positive-edge-triggered third one-shot trigger, and the second flip-flop 41, the second delayer 51, and the third delayer 52 constitute a positive-edge-triggered fourth one-shot trigger.

The second NOR gate 150 performs an NOR logic operation on the first differential signal ix and the second differential signal iy. According to the result of operation, the second NOR gate 150 outputs the signal to the second NAND gate 110. The second NAND gate 110 performs an NAND logic operation on the signal output from the second NOR gate 150 and a clear signal clear. The clear signal clear remains in a high-level state during a silence period after the system is turned on, and the second NAND gate 110 outputs the signal to the third inverter 141 according to the result of operation. Then, the third inverter 141 inverts the signal output from the second NAND gate 110, and outputs the inverted signal to the third one-shot trigger. Finally, the first flip-flop 40 outputs the clock signal clk through a Q terminal thereof (as shown in FIG. 6A).

The third NAND gate 111 performs an NAND logic operation on the third differential signal ix1 and the clear signal clear. According to the result of operation, the third NAND gate 111 outputs the signal to the fourth inverter 142. Then, the fourth inverter 142 inverts the signal output from the third NAND gate 11, and outputs the inverted signal to the fourth one-shot trigger. Finally, the fifth flip-flop 44 outputs the data signal data through a Q terminal thereof (as shown in FIG. 6A).

Figure 7B:
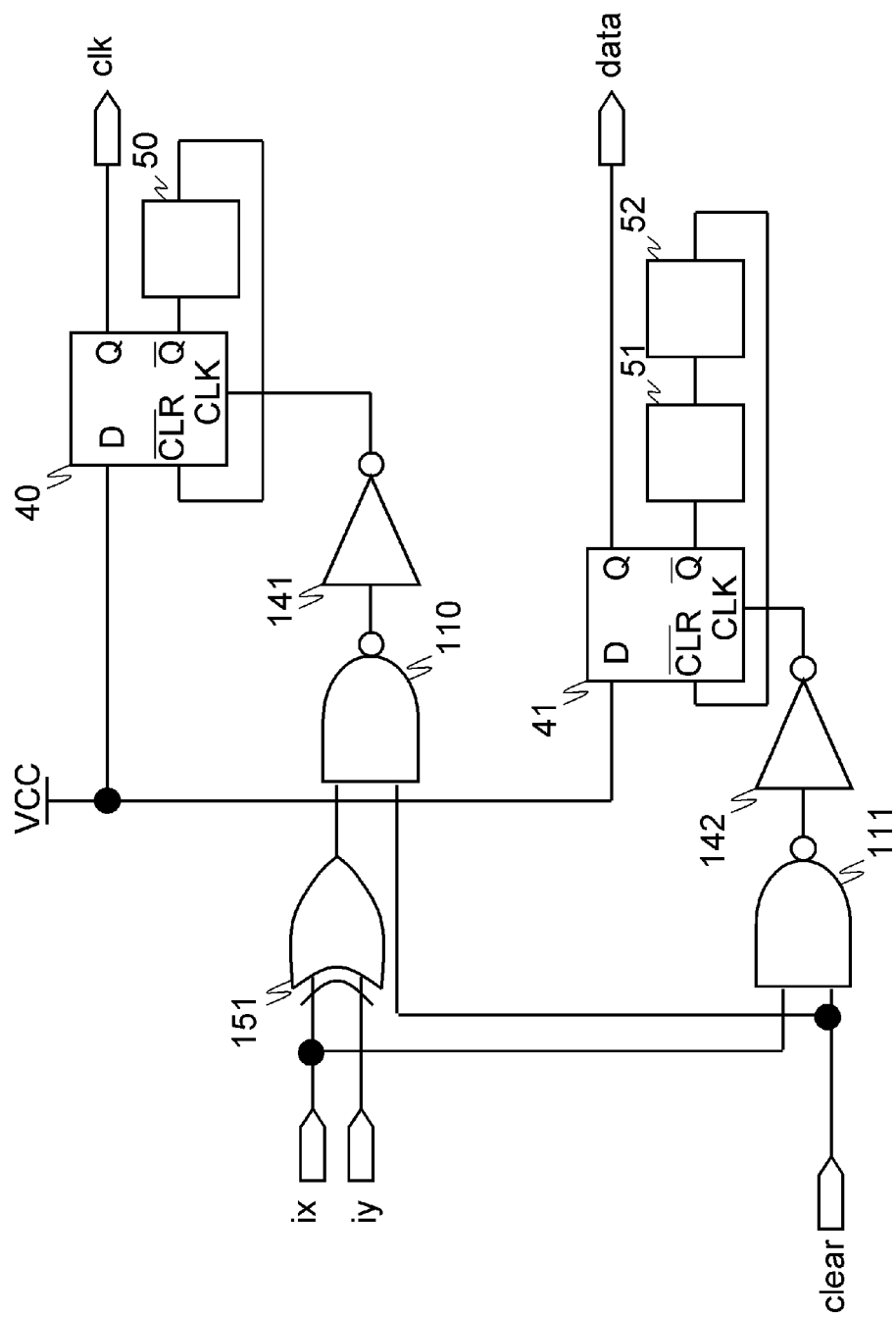
FIG. 7B is another schematic circuit diagram of the signal decoder of the present invention.

FIG. 7B is another schematic circuit diagram of the signal decoder of the present invention. The difference between FIGS. 7B and 7A lies in that in FIG. 7B, the negative-edge-triggered third one-shot trigger and the negative-edge-triggered fourth one-shot trigger are used, and the second NOR gate 150 is replaced by an XOR gate 151. Other operating manners of the circuit are similar to those of FIG. 7A, and will not be described herein again.

Figure 7C:
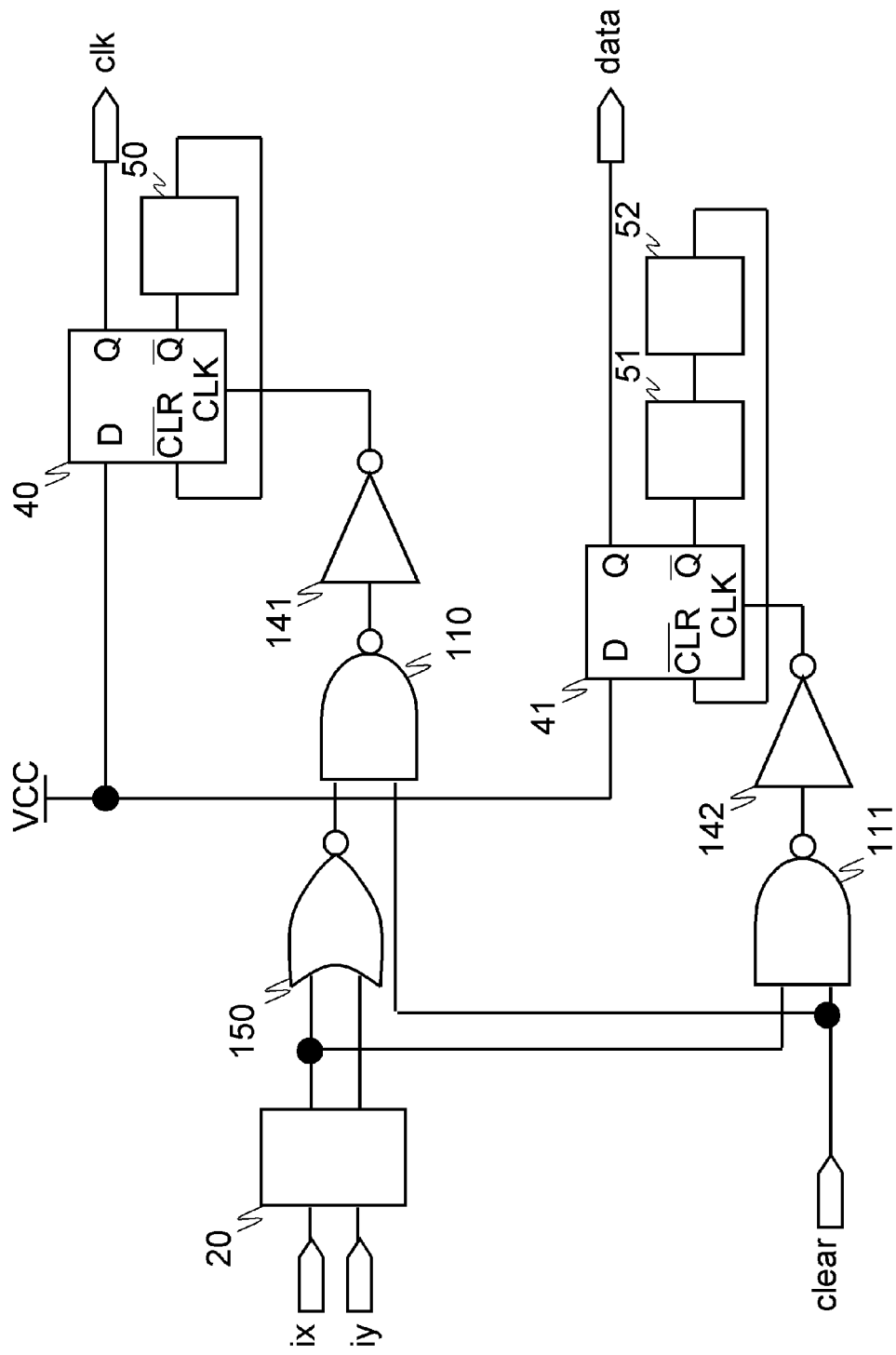
FIG. 7C is another schematic circuit diagram of the signal decoder of the present invention.

FIG. 7C is another schematic circuit diagram of the signal decoder of the present invention. The difference between FIGS. 7C and 7A lies in that a level correction circuit 20 is added in FIG. 7C, so as to correct the first differential signal ix and the second differential signal iy to the third differential signal ix1 and the fourth differential signal iy1 of accurate levels. Other operating manners of the circuit are similar to those of FIG. 7A, and will not be described herein again.

FIG. 8 is a schematic circuit diagram of a signal selector of the present invention. The signal selector selectively outputs a set of third differential signals ix1 and fourth differential signals iy1 or a set of clock signals clk and data signals data, which are provided for the receiving terminal (e.g., with the signal decoder or without the signal decoder ) to read. The signal selector can be disposed between the level correction circuit 20 and the signal decoder 200. As shown in FIG. 8, the signal selector of the present invention includes a first multiplexer 30, a second multiplexer 31, a third flip-flop 42, a fourth flip-flop 43, a fifth flip-flop 44, a fourth delayer 53, a fifth delayer 54, a sixth delayer 55, a seventh delayer 56, a fourth NAND gate 112, a fifth NAND gate 113, a fifth inverter 143, and a sixth inverter 144. The third flip-flop 42 and the fourth delayer 53 constitute a fifth one-shot trigger, the fourth flip-flop 43 and the fifth delayer 54 constitute a sixth one-shot trigger, and the fifth flip-flop 44, the sixth delayer 55, and the seventh delayer 56 constitute a seventh one-shot trigger.

The first multiplexer 30 receives the third differential signal ix1 and the clock signal clk output from the first comparator 21, and selectively outputs the third differential signal ix1 or the clock signal clk according to a select signal sel. The fifth one-shot trigger receives and outputs the third differential signal ix1 or the clock signal clk, and sets the pulse width of the third differential signal ix1 or the pulse width of a half cycle of the clock signal signal clk to be the same as or different from the pulse width of the original third differential signal ix1 or the pulse width of a half cycle of the clock signal clk, so as to output the third differential signal ix1 or the clock signal clk. The sixth one-shot trigger receives the fourth differential signal iy1, and sets the pulse width of the fourth differential signal iy1 to be the same as or different from the pulse width of the original fourth differential signal iy1, so as to output the fourth differential signal iy1. The fourth NAND gate 112 performs the NAND logic operation on the data signal data and the clock signal clk and outputs a signal. The fifth inverter 143 receives the signal output from the fourth NAND gate 112 and performs the inverting logic operation on the signal. The seventh one-shot trigger receives the signal output from the fifth inverter 143, and sets the pulse width of the signal to be the same as or different from the pulse width of the original signal. The fifth NAND gate 113 receives the signal output from the seventh one-shot trigger, and performs the NAND logic operation on the signal and the data signal data. The sixth inverter 144 receives the signal output from the fifth NAND gate 113, and performs the inverting logic operation on the signal. The second multiplexer 31 receives the fourth differential signal iy1 output from the sixth one-shot trigger and the signal output from the sixth inverter 144, and selectively outputs the fourth differential signal iy1 or the data signal data according to the select signal sel.

When the select signal is logic one, the first multiplexer 30 outputs the third differential signal ix1 to a CLK terminal of the third flip-flop 42, and a Q terminal of the third flip-flop 42 outputs the third differential signal ix1. A Q terminal of the fourth flip-flop 43 outputs the fourth differential signal iy1 to the second multiplexer 31, and the second multiplexer 31 outputs the fourth differential signal iy1.

When the select signal is logic zero, the first multiplexer 30 outputs the clock signal clk to the CLK terminal of the third flip-flop 42, and the Q terminal of the third flip-flop 42 outputs the clock signal clk. The fourth NAND gate 112 performs the NAND logic operation on the data signal data and the clock signal clk, and outputs a signal to the fifth inverter 143. Then, the seventh one-shot trigger constituted of the fifth flip-flop 44, the sixth delayer 55, and the seventh delayer 56 transmits the signal to the fifth NAND gate 113. The fifth NAND gate 113 performs the NAND operation on the data signal data and the signal output from the Q terminal of the fifth flip-flop 44, and then transmits the signal to the sixth inverter 144. The sixth inverter 144 inverts the signal, and transmits the inverted signal to the second multiplexer 31. The second multiplexer 31 outputs the data signal data.

To sum up, the signal encoder and the signal decoder of the present invention transmits the encoded clock signal and data signal to the receiving terminal through an encoding operation, and recover the clock signal and data signal at the receiving terminal through a decoding operation process (or directly reading only without performing the decoding recovery process at the receiving terminal). Thus, the signal transmission process has the advantage of noise-proof like the differential transmission mode, and the signal recovery process has the advantage of easy recovery like the data-clock transmission mode.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A signal encoder, for receiving a data signal composed of a plurality of logic zeros and a plurality of logic ones and a clock signal, and outputting a differential signal corresponding to the data signal and the clock signal, the signal encoder comprising a first code output terminal and a second code output terminal, wherein when the data signal is logic one, the signal encoder outputs a modulated signal through the first code output terminal to be as the differential signal and outputs a fixed level signal through the second code output terminal to be as the differential signal, and when the data signal is logic zero, the signal encoder outputs the fixed level signal through the first code output terminal to be as the differential signal and outputs the modulated signal through the second code output terminal to be as the differential signal.

2. The signal encoder as claimed in claim 1, further comprising a logic circuit, for receiving the data signal and the clock signal, wherein the logic circuit outputs a modulated signal through the first code output terminal and a fixed level signal through the second code output terminal when the data signal is logic one, and wherein the logic circuit outputs the fixed level signal through the first code output terminal and the modulated signal through the second code output terminal when the data signal is logic zero.

3. The signal encoder as claimed in claim 1, wherein the fixed level signal is a level signal of logic zero.

4. The signal encoder as claimed in claim 1, wherein the fixed level signal is a level signal of logic one.

5. The signal encoder as claimed in claim 1, wherein the modulated signal is composed of a plurality of low-level signals and a plurality of high-level signals.

6. The signal encoder as claimed in claim 1, wherein a pulse width of the modulated signal is equal to that of a half cycle of the clock signal.

7. The signal encoder as claimed in claim 1, wherein the logic circuit further comprises:
  a first NAND gate, for receiving the data signal through a first input terminal of the first NAND gate, receiving the clock signal through a second input terminal of the first NAND gate, and performing an NAND operation on the data signal and the clock signal to output a first signal through an output terminal of the first NAND gate;
  a first inverter, electrically connected with the first NAND gate, the first inverter for receiving the first signal output from the first NAND gate through an input terminal of the first inverter, and performing an inverting operation on the first signal to output the inverted first signal through an output terminal of the first inverter;
  a first one-shot trigger, electrically connected with the first inverter, the first one-shot trigger for receiving the first signal and setting a pulse width of the first signal;
  a second inverter, for receiving the clock signal through an input terminal of the second inverter, and performing the inverting operation on the clock signal to output the inverted clock signal through an output terminal of the second inverter;

a first NOR gate, electrically connected with the second inverter, the first NOR gate for receiving the inverted clock signal output from the second inverter through a first input terminal of the first NOR gate, receiving the data signal through a second input terminal of the first NOR gate, and performing an NOR operation on the data signal and the inverted clock signal to output a second signal through an output terminal of the first NOR gate; and a second one-shot trigger, electrically connected with the first inverter, the second one-shot trigger for receiving the second signal and setting a pulse width of the second signal.

8. The signal encoder as claimed in claim 7, wherein the first one-shot trigger and the second one-shot trigger are positive-edge-triggered one-shot triggers.

9. The signal encoder as claimed in claim 1, wherein the logic circuit further comprises:

a first NAND gate, for receiving the data signal through a first input terminal of the first NAND gate, receiving the clock signal through a second input terminal of the first NAND gate, and performing an NAND operation on the data signal and the clock signal to output a first signal through an output terminal of the first NAND gate;

a first one-shot trigger, electrically connected with the first NAND gate, the first one-shot trigger for receiving the first signal and setting a pulse width of the first signal;

a second inverter, for receiving the clock signal through an input terminal of the second inverter, and performing the inverting operation on the clock signal to output the inverted clock signal through an output terminal of the second inverter;

an OR gate, electrically connected with the second inverter, the OR gate for receiving the inverted clock signal output from the second inverter through a first input terminal of the OR gate, receiving the data signal through a second input terminal of the OR gate, and performing an OR operation on the data signal and the inverted clock signal to output a second signal through an output terminal of the OR gate; and a second one-shot trigger, electrically connected with the first inverter, the second one-shot trigger for receiving the second signal and setting a pulse width of the second signal.

10. The signal encoder as claimed in claim 9, wherein the first one-shot trigger and the second one-shot trigger are negative-edge-triggered one-shot triggers.

11. A signal decoder, used with the signal encoder as claimed in claim 1, for allowing a receiving terminal to read a clock signal and a data signal, the signal decoder comprising a first decode output terminal and a second decode output terminal, and receiving the modulated signal and the fixed level signal output from the first code output terminal and the second code output terminal of the signal encoder, wherein when the modulated signal comes from the first code output terminal and the fixed level signal comes from the second code output terminal, the signal decoder outputs the data signal of logic one through the second decode output terminal, and outputs the clock signal through the first decode output terminal, and when the fixed level signal comes from the first code output terminal and the modulated signal comes from the second code output terminal, the signal decoder outputs the data signal of logic zero through the second decode output terminal, and outputs the clock signal through the first decode output terminal.

12. The signal decoder as claimed in claim 11, further comprising:

a second NOR gate, for performing an NOR logic operation on the modulated signal and the fixed level signal;

a second NAND gate, for receiving the signal output from the second NOR gate and a clear signal, and performing an NAND logic operation on the signal output from the second NOR gate and the clear signal;

a third inverter for receiving the signal output from the second NAND gate, and performing an inverting logic operation on the signal output from the second NAND gate;

a third one-shot trigger, for receiving the signal output from the third inverter, so as to output the clock signal;

a third NAND gate, for receiving a differential signal and the clear signal, and performing the NAND logic operation on the differential signal and the clear signal;

a fourth inverter for receiving the signal output from the third NAND gate, and performing the inverting logic operation on the signal output from the third NAND gate; and a fourth one-shot trigger, for receiving the signal output from the fourth inverter, so as to output the data signal.

13. The signal decoder as claimed in claim 11, further comprising:

an XOR gate, for performing an XOR operation on the differential signal;

a second NAND gate, for receiving the signal output from the XOR gate and a clear signal, and performing the NAND logic operation on the signal output from the XOR gate and the clear signal;

a third inverter for receiving the signal output from the second NAND gate, and performing the inverting logic operation on the signal output from the second NAND gate;

a third one-shot trigger, for receiving the signal output from the third inverter, so as to output the clock signal;

a third NAND gate, for receiving the differential signal and the clear signal, and performing the NAND operation on the differential signal and the clear signal;

a fourth inverter for receiving the signal output from the third NAND gate, and performing the inverting logic operation on the signal output from the third NAND gate;

a fourth one-shot trigger, for receiving the signal output from the fourth inverter, so as to output the data signal.

14. The signal decoder as claimed in claim 11, wherein a level correction circuit is further disposed between the signal encoder and the signal decoder, the level correction circuit for receiving the differential signal output from the signal encoder, and correcting a level of the differential signal, so as to make the level of the differential signal to be in conformity with the level of the receiving terminal and then transmitted to the signal decoder.

15. The signal decoder as claimed in claim 14, wherein the level correction circuit further comprises:

a first comparator, for receiving the differential signal output from the first code output terminal of the signal encoder through a first input terminal of the first comparator, receiving the differential signal output from the second code output terminal of the signal encoder through a second input terminal of the first comparator, and outputting a third differential signal through an output terminal of the first comparator; and a second comparator, for receiving the differential signal output from the second output terminal of the signal encoder through a first input terminal of the second comparator, receiving the differential signal output from the first code output terminal of the signal encoder through a second input terminal of the second comparator, and output a fourth differential signal through an output terminal of the second comparator.

16. The signal decoder as claimed in claim 15, wherein a signal selector is further disposed between the level correction circuit and the signal decoder, and the signal selector comprises:
- a first multiplexer, for receiving the third differential signal output from the first comparator and the clock signal, and selectively outputting the third differential signal or the clock signal according to a select signal;
- a fifth one-shot trigger, for receiving and outputting the third differential signal or the clock signal;
- a fifth one-shot trigger, for receiving and outputting the fourth differential signal;
- a third NAND gate, for performing the NAND logic operation on the data signal and the clock signal, and outputting a signal;
- a fifth inverter for receiving the signal output from the third NAND gate, and performing the inverting logic operation on the signal;
- a sixth one-shot trigger, for receiving the signal output from the fifth inverter;
- a fourth NAND gate, for receiving the signal output from the sixth one-shot trigger, and performing the NAND logic operation on the signal and the data signal;
- a sixth inverter, for receiving the signal output from the fourth NAND gate, and performing the inverting logic operation on the signal; and
- a second multiplexer, for receiving the fourth differential signal output from the fifth one-shot trigger and the signal output from the sixth inverter, and selectively outputting the fourth differential signal or the data signal according to the select signal.

* * * * *